US007198882B2

(12) United States Patent
Higgins et al.

(10) Patent No.: US 7,198,882 B2
(45) Date of Patent: Apr. 3, 2007

(54) ADHESION PROMOTING POLYMERIC MATERIALS AND PLANOGRAPHIC PRINTING ELEMENTS CONTAINING THEM

(75) Inventors: John M. Higgins, Middlesex (GB); Ian M. Newington, Buckinghamshire (GB); Charles C. Anderson, Penfield, NY (US); Harjit S. Bhambra, Delta (CA); Janglin Chen, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 173 days.

(21) Appl. No.: 10/988,656

(22) Filed: Nov. 15, 2004

(65) Prior Publication Data

US 2005/0095536 A1 May 5, 2005

Related U.S. Application Data

(63) Continuation-in-part of application No. 10/300,345, filed on Nov. 20, 2002, now abandoned.

(51) Int. Cl.
*G03F 7/11* (2006.01)

(52) U.S. Cl. .............................. 430/276.1; 430/271.1; 430/272.1; 430/954; 430/535

(58) Field of Classification Search ............. 430/272.1, 430/271.1, 534, 535, 954, 276.1; 428/32.23, 428/32

See application file for complete search history.

(56) References Cited

U.S. PATENT DOCUMENTS 4,130,424 A 12/1978 Feit et al.
4,689,359 A 8/1987 Ponticello et al.
4,695,532 A 9/1987 Ponticello et al.
5,340,676 A * 8/1994 Anderson et al. ............. 430/63
5,447,832 A * 9/1995 Wang et al. ................ 430/523
5,639,589 A 6/1997 Bauer et al.
6,162,597 A 12/2000 Bauer et al.
2004/0063023 A1 4/2004 Rao et al.

FOREIGN PATENT DOCUMENTS

WO WO 97/19819 A1 * 6/1997
WO WO 9852769 A1 * 11/1998

OTHER PUBLICATIONS

Scalar technologies "http://www.scalartechnologies.com/glossary.htm", Glossary, two pages printed out Jun. 25, 2006."Thin film weight measurement glossary of terms".*

* cited by examiner

*Primary Examiner*—Cynthia Hamilton

(57) ABSTRACT

The present invention provides a planographic printing element suitable to receive and bond with a subsequently applied hydrophilic layer comprises a substrate layer, such as polyester film or paper, having coated thereon an adhesion layer, said adhesion layer comprising a polymer having a glass transition temperature of less than 15C and containing functional groups such as hydroxyl, epoxy or glycidyl groups capable of reacting with the hydrophilic layer. The polymer may be a terpolymer of a hydroxyalkyl methacrylate, an alkyl acrylate and an aminoalkyl methacrylate. The polymer may be mixed with gelatin and the mixture applied to the substrate as a coating. The hydrophilic layer, which may comprise metal oxide particles, such as aluminium oxide and/or titanium dioxide particles in a sodium silicate binder, is subsequently applied as a coating to the adhesion layer.

18 Claims, 3 Drawing Sheets

Figure 2. Polymer A.
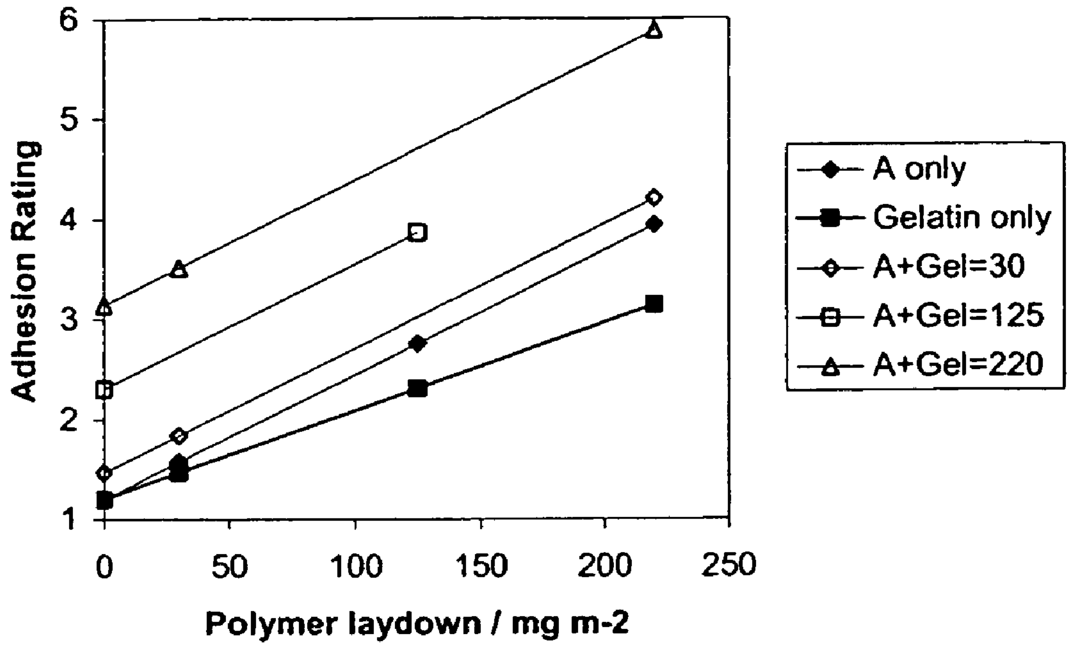
Figure 3. Polymer B.
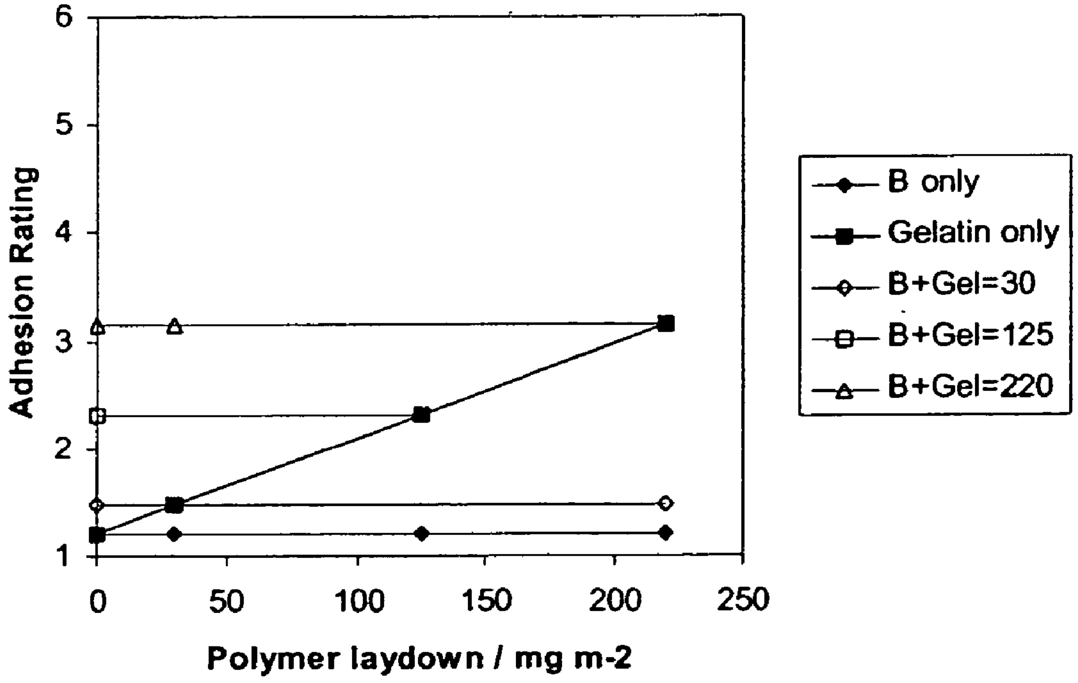

Figure 4. Polymer C.
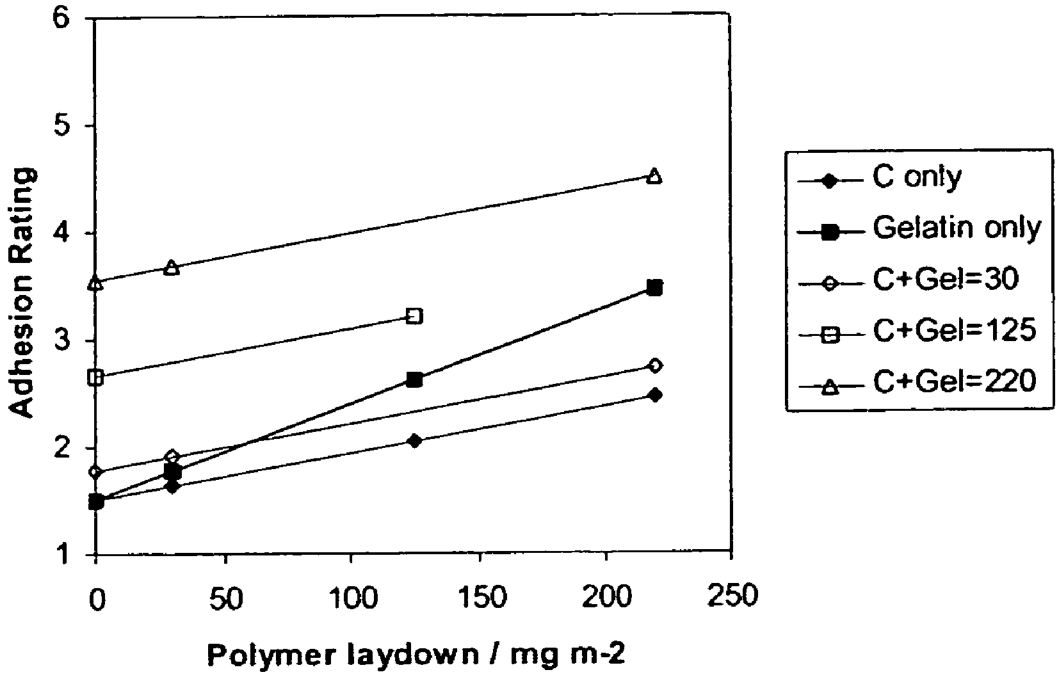
Figure 5. Polymer D.
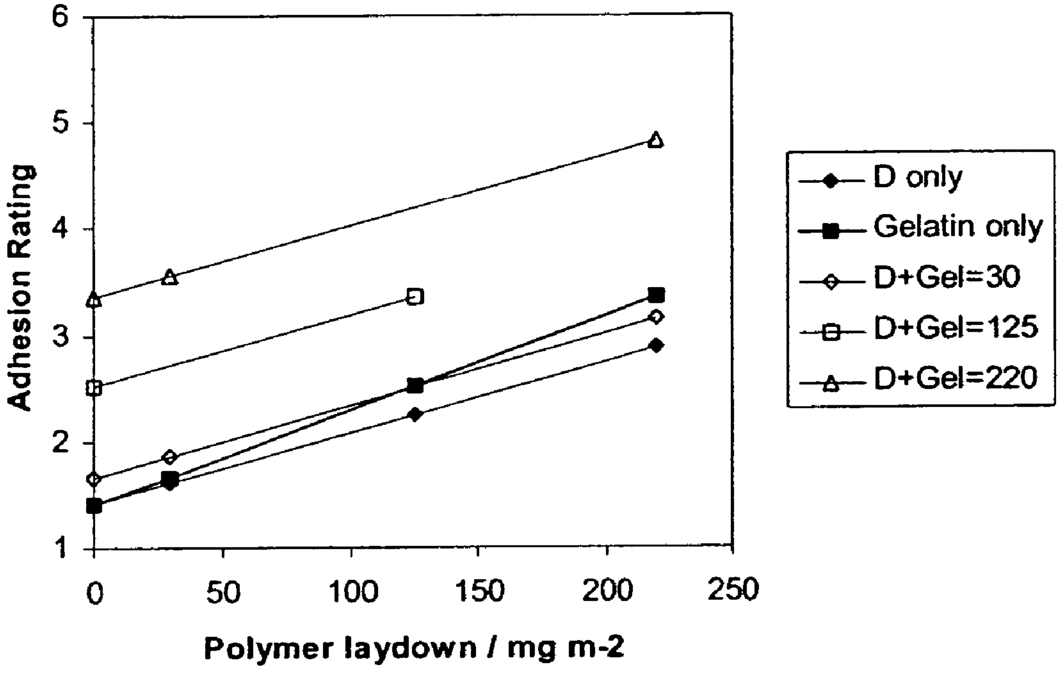

ADHESION PROMOTING POLYMERIC MATERIALS AND PLANOGRAPHIC PRINTING ELEMENTS CONTAINING THEM

CROSS REFERENCE TO RELATED APPLICATION

This application is a continuation-in part of U.S. Ser. No. 10/300,345 filed 20 Nov. 2002 now abandoned.

FIELD OF THE INVENTION

This invention relates to planographic printing elements and a method for their preparation.

BACKGROUND OF THE INVENTION

One form of planographic printing is lithographic printing which relies on the immiscibility of oil and water, wherein the oily material or ink is preferentially retained by the image area of a lithographic printing plate. When a suitably prepared surface is moistened with water and an ink is then applied, the background or non-image area retains the water and repels the ink while the image area accepts the ink and repels the water.

The ink on the image area is then transferred to a surface of a material upon which the image is to be reproduced, such as paper, cloth and the like. Commonly the ink is transferred to an intermediate material called the blanket which in turn transfers the ink to the surface of the material upon which the image is to be reproduced. Because planographic printing is an 'impact method' of printing, the elements are subjected to considerable pressure and abrasion while used to print multiple images.

The production of printing elements for use in lithographic printing requires the formation of a hydrophilic layer on a substrate.

PROBLEM TO BE SOLVED BY THE INVENTION

There is a continuing need to improve the adhesion between the hydrophilic layer and the substrate on which it is based. The present invention provides a solution to this problem by providing a planographic printing element in which the hydrophilic layer is bound to the substrate by a selected polymer.

SUMMARY OF THE INVENTION

According to the present invention there is provided a planographic printing element suitable to receive and bond with a subsequently applied hydrophilic layer said element comprising:

(i) a substrate layer having coated thereon (ii) an adhesion layer, said adhesion layer comprising a polymer having a glass transition temperature of less than 15 C and containing functional groups capable of bonding with a hydrophilic layer when the latter is applied as a coating.

In another aspect there is a planographic printing element comprising:

(i) a substrate layer having coated thereon (ii) an adhesion layer and (iii) a hydrophilic layer coated on and bonded to the adhesion layer, said adhesion layer comprising a polymer having a glass transition temperature of less than 15 C and containing functional groups capable of bonding with the hydrophilic layer.

According to a further aspect of the present invention a method for the preparation of a planographic printing element suitable to receive and bond with a subsequently applied hydrophilic layer comprises:

applying to a substrate a coating of a polymer having a glass transition temperature of less than 15° C. said polymer containing functional groups capable of reacting with corresponding groups in the hydrophilic layer.

ADVANTAGEOUS EFFECT OF THE INVENTION

By the use of the polymeric layer containing functional groups capable of bonding with groups in the hydrophilic layer, the adhesion of the hydrophilic layer to the substrate is significantly increased and an improved printing element provided.

BRIEF DESCRIPTION OF THE DRAWINGS

FIGS. 2 to 5 are graphs showing how the adhesion rating varies with polymer laydown for polymers A, B, C and D.

DETAILED DESCRIPTION OF THE INVENTION

Figure 1:
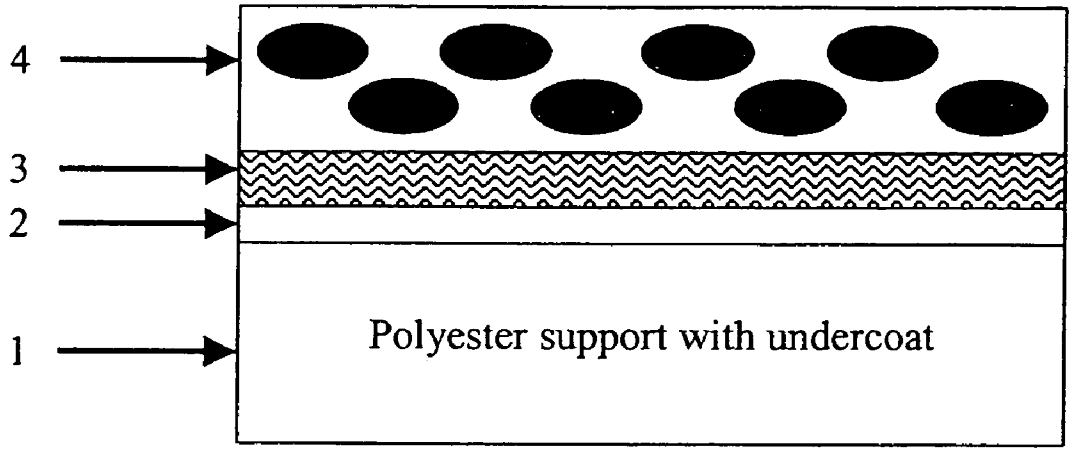
FIG. 1 is a schematic drawing showing a planographic printing element according to the invention.

A planographic printing element is used in a non-relief printing process, such as lithography, in which the areas of the printing plate to receive ink are on the same level or 'plane' as those that remain un-inked, see Dictionary of Scientific and Technical Terms, 3rd Edition, McGraw-Hill Book Company. As such, the purpose of the element is to make multiple image reproductions by planographic printing, in contrast to, say, a photographic element in which, typically, a single image is formed directly or indirectly by the action of light or other forms of radiation on sensitive surfaces, see Dictionary as above.

The term 'polymer' in the present specification is intended to include copolymers and terpolymers unless the context requires otherwise.

The glass transition temperature (Tg) is the critical temperature at which a polymer will lose the properties of glass and obtain the properties of an elastomer. As used herein and specifically in the claims a glass transition temperature (Tg) of less than 15 C refers to the Tg of a polymer, co-monomer or terpolymer when prepared by latex polymerisation and as measured by the method of Differential Scanning Calorimetry (DSC), as described hereinafter.

The Adhesion Layer

The polymer applied as the adhesion layer is conveniently obtained by the polymerisation of a monomer containing the functional groups. The polymer may comprise a latex polymer prepared from a monomer containing functional groups that can react with corresponding groups in the hydrophilic layer by either condensation or addition reactions.

Suitable polymers include those described in U.S. Pat. Nos. 4,695,532 and 4,689,359, the disclosures of which are incorporated by reference. In particular, suitable polymers are those of hydroxyalkyl methacrylates, such as 2-hydroxyethyl methacrylate or 3-chloro-2-hydroxypropyl methacrylate. The polymer may contain at least 25%, preferably from about 25 to 85 wt %, more preferably about 35 to 55 wt % of monomers containing units having such functional groups.

A co-monomer may be employed to assist in obtaining the required glass transition temperature of less than 15 C. An example of such a co-monomer is an alkyl acrylate, such as n-butyl acrylate or ethyl acrylate. The co-monomer may be present in amount from 15 to 75 wt %, preferably 45 to 65 wt %.

A further co-monomer may be added to cross-link with gelatin by use of conventional gelatin hardeners (e.g. bis (vinylsulfonyl)methane or the like) such as an aminoalkyl methacrylate, for example 2-aminoethyl methacrylate hydrochloride or an aminoalkyl methacrylamide, such as 3-aminopropyl-methacrylamide hydrochloride. The further co-monomer may be present in amounts of 0.5 to 10 wt. %, preferably 1 to 7 wt. %

In each instance the % by wt. are based on the combined weight of the monomers present.

One class of preferred polymers are terpolymers of (a) a hydroxyalkyl methacrylate, (b) an alkyl acrylate and (c) an aminoalkyl methacrylate. Typical relative amounts of the monomers are: (a) from about 20 to about 80 (b) about 20 to about 70 and (c) from about 2 to about 10, selected such that the polymer has a Tg of less then 15 C.

Another preferred class of polymers are copolymers of (i) glycidyl methacrylate and (ii) an alkyl acrylate, such as butyl acrylate. Typical relative amounts of monomer (i) are from 90 to about 50 of monomer, and monomer (ii) from about 10 to about 50, selected such that the polymer has a Tg of less then 15 C.

Examples of suitable functional groups contained in the polymer are hydroxy, epoxy, glycidyl and groups such as halide or sulfonate ester which are capable of being displaced by a nucleophilic group.

The polymers of this invention may be prepared by latex polymerization, or solution polymerization followed by dispersion of the polymer in water by addition of the organic solution to water containing a surfactant, as described in U.S. Pat. No. 4,689,359, the disclosure of which is incorporated by reference.

Both latex polymerization and solution polymerization are well known, see for example, W. R. Sorenson and T. N. Campbell, "Preparative Methods of Polymer Chemistry", 2nd Ed., J. Wiley and Sons, New York, N.Y. (1968) and M. R. Stevens, "Polymer Chemistry, an Introduction", Addison-Wesley Publishing Co., Inc., London (1975).

In latex polymerization the selected monomers are colloidally emulsified in an aqueous medium that usually contains a cationic, nonionic, or zwiterionic surfactant and a polymerization catalyst such as 2,2'-azobis-(2-amidinopropane)hydrochloride. The resulting colloidal emulsion is then subjected to conditions conducive to polymerization of the monomeric constituents to produce an aqueous colloidal dispersion, commonly called a latex.

Solution polymerization generally involves dissolving the selected monomers in an organic solvent containing a polymerization initiator such as 4,4'-azobis(4-cyanovaleric acid), 2,2'-azobis(2-methyl-propionitrile) or 2,2'-azo-bis(2-amidinopropane)hydrochloride. The solution is maintained under a nitrogen atmosphere and heated at about 60 C. The resulting polymer is then dispersed in water at about 1–5% solids. The polymer is then purified by diafiltration.

U.S. Pat. No. 4,689,359, the disclosure of which is incorporated by reference, discloses that the adhesion of a coating composition containing gelatin to a discharge treated polyester film support can be improved by incorporating in the gelatin one or more defined polymers. The problem with which this patent is concerned is the bonding of a gelatin-containing composition to a polyester support used for making photographic elements. In contrast, the problem addressed by the present invention is the bonding of the support (which may be polyester) to a hydrophilic layer employed in the preparation of planographic printing elements.

The polymers employed in the present invention may be blended with gelatin and the composition thereby obtained applied as a coating to the substrate.

The polymer may be applied to the substrate as a composition containing the polymer in admixture with gelatin, preferably in relative amounts of from 95:5 to 5:95 preferably from 95:5 to 40:60 by weight.

The laydown of polymer or polymer gelatin composition on the substrate is conveniently at least 50 $mg/m^2$ to 4 $g/m^2$, preferably from 100 mg to 2 $g/m^2$, more preferably from 100 $mg/m^2$ to 500 $mg/m^2$.

Typical thicknesses of the polymer coating are from about 0.05 μm up to about 4 μm.

Such polymer and polymer/gelatin compositions may also include surfactants to provide suitable wetting characteristics, opaque or coloured materials to provide suitable backgrounds, conducting materials to provide anti-static qualities and cross-linking agents to provide sufficient robustness. In addition, materials to adjust pH, particularly to achieve specific conditions intended to facilitate a reaction with an overlying layer, can also be included. These compositions can be coated as a single layer or as a part of multilayer structure.

The Substrate

The substrate may be any one of those known in the planographic printing art. For example the substrate may comprise a polyester film such as polyethylene terephthalate, cellulose acetate film, or other polymer film such as polyethylene or paper such as resin-coated paper, or may comprise metal, although a paper or especially a film substrate is preferred.

In the case of a polyester or similar support, the adhesion of the adhesion layer thereto may be improved by the provision of a layer that provides a key for the adhesion layer, or alternatively, by a surface treatment of the polyester with a corona or glow-discharge as described in U.S. Pat. No. 4,689,359, the disclosure of which is incorporated by reference.

The Hydrophilic Layer

The hydrophilic layer contains functional groups, such as for example, —Si—OH, hydroxy or alkoxide. It may comprise inorganic oxide particles, such as metal oxide particles, for example aluminium oxide and titanium dioxide, together with a binder, such as an alkali metal silicate. Preferred silicates include lithium, sodium and potassium silicates, with lithium and/or sodium silicate being especially preferred. A silicate solution comprising only sodium silicate is most preferred. Suitable hydrophilic layers and their preparation are described in WO 97/19819 and EP-A-0 963 859, the disclosures of which are incorporated by reference.

In accordance with the method of the invention, after the application of the adhesion layer to the substrate, a subsequent step comprises applying a hydrophilic material to the adhesion layer as a coating to form the hydrophilic layer and provide a printing element that can be used in planographic printing.

The invention is illustrated by reference to the following Examples but is not to be construed as limited thereto.

All the polymers used in the Examples had a glass transition temperature of less than 15 C, as specified herein.

EXAMPLE 1

Polymers A and B, shown below, were coated with the surfactant saponin as a coating aid at approx. 8.5 mg $m^{-2}$ of saponin. Some coatings were composed polymer and saponin and other coatings also contained gelatin. The coatings were applied onto a polyester support with a pre-applied hard undercoat layer (the purpose of which was to provide a key for the adhesion layer) to give a series of adhesion layers with varying component laydowns.

Polymer A is poly(butyl acrylate-co-2-aminoethyl methacrylate hydrochloride-co-2-hydroxyethylmethacrylate) (50:5:45), having a Tg of $^{-}16$ C.

Polymer B is poly(butyl acrylate-co-2-aminoethyl methacrylate hydrochloride-co-2-methoxyethylmethacrylate) (50:5:45), having a Tg of $^{-}10$ C but no functional group.

Polymer A.
(50/5/45)

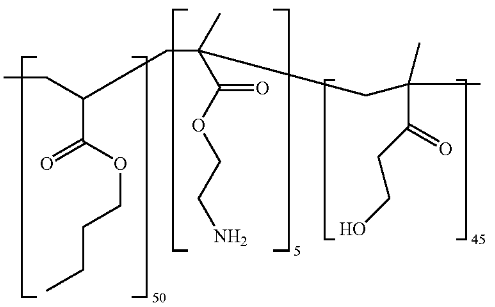

Polymer B.
(50/5/45)

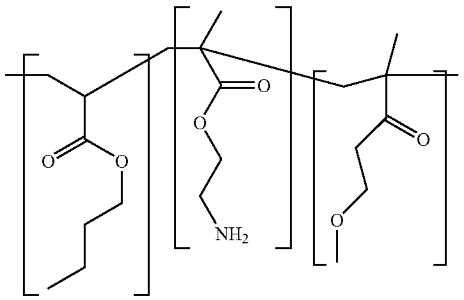

The resulting layers were then overcoated with a hydrophilic layer comprising of a mixture of alumina and titania particles in a sodium silicate binder, in a manner described fully in WO 97/19819, to give a total dry laydown of approximately 10 g $m^{-2}$.

The final coating structure is shown in FIG. 1 below.

FIG. 1 shows an optional hard undercoat layer (2) on the polyester support (1) which has been applied before the adhesion layer (3) to provide a key therefor. The hydrophilic layer (4) is coated over the adhesion layer (3).

An alternative would be to apply the adhesion layer directly onto the bare polyester support after the latter has been treated by corona or glow-discharge, as described for example in U.S. Pat. No. 4,689,359.

These planographic printing elements were then evaluated for adhesion. The tests were performed by scoring the coatings with a razor blade in a grid pattern (five 1" lines, 0.2" apart and another five lines at a 45° angle to the first set). A piece of 610 scotch tape (3M company) was applied to the scored area and the tape rapidly peeled off in an effort to remove the hydrophilic layer. The coatings were ranked using a scale of 1 to 6 where 6=Good (no removal of the coating) and 1=Poor (complete removal of the coating).

The results obtained from these tests, which are average values from several coatings, are given in FIGS. 2 and 3.

It can be seen in FIG. 2 that, as the laydown of Polymer A was increased, the adhesion of the hydrophilic layer increased, producing an effect superior to that obtained with gelatin alone. In addition, it was also possible to coat useful mixtures of Polymer A and gelatin. However FIG. 3 shows that Polymer B (which contains no functional groups capable of bonding with the hydrophilic layer) had no useful effect and also that varying the laydown of polymer B had no discernible effect, even in combination with gelatin.

Polymer B is included for comparative purposes and does not form part of the present invention.

The glass transition temperatures measured on dried samples using a Perkin Elmer DSC7 thermal analyzer. Samples were first heated to a temperature above their Tg and then cooled to a temperature well below their Tg in order to eliminate any thermal history from the materials as received. Samples were then heated at 10 C/min. and the specific heat curves recorded. The glass transition appears as an endothermic stepwise change in the specific heat curve for the sample and the Tg was calculated to be the value at the midpoint of this step change in the second heating cycle.

EXAMPLE 2

Polymers C and D shown below were coated with the surfactant saponin at approx. 8.5 mg $m^{-2}$, and sometimes with gelatin, onto a polyester support with a pre-applied undercoat layer (*) to give a series of adhesion layers with varying component laydowns.

(* It would have been equally possible, but less experimentally convenient, to apply the adhesion layer directly to bare polyester support assisted by corona or glow-discharge treatments as demonstrated in the prior art noted above).

Polymer C is poly(butyl acrylate-co-2-aminoethyl methacrylate hydrochloride-co-3-chloro-2-hydroxypropyl methacrylate) (50:5:45), having a Tg of $^{+}10$ C and polymer D is poly(glycidyl methacrylate-co-butyl acrylate) (75:25), having a Tg of $^{+}10$ C.

Polymer C
(50/5/45)

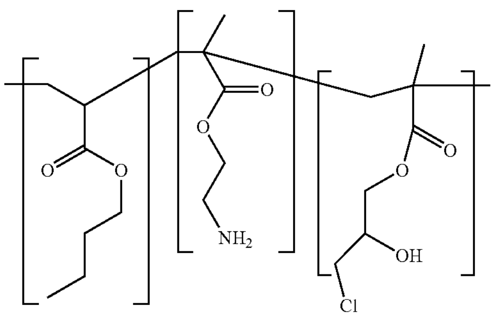

-continued

Polymer D
(75/25)

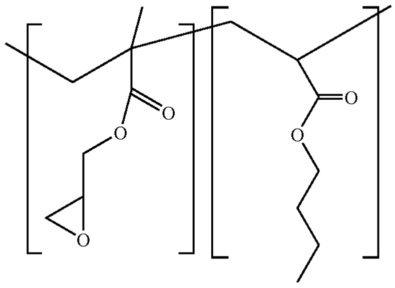

The resulting layers were then overcoated with a hydrophilic layer comprising a mixture of alumina and titania particles in a sodium silicate binder, in a manner described fully in WO 97/19819, to give a total dry laydown of approximately 10 g $m^{-2}$. The final coating structure is given in FIG. 1 above.

These planographic elements were evaluated for adhesion. The tests were performed by scoring the coatings with a razor blade in a grid pattern (five 1" lines, 0.2" apart and another five lines at a 45° angle to the first set). A piece of 610 scotch tape (3M company) was applied to the scored area and the tape rapidly peeled off in an effort to remove the hydrophilic layer. The coatings were ranked using a scale of 1 to 6 where 6=Good (no removal of the coating) and 1=Poor (complete removal of the coating).

The results obtained from these tests, which are average values from several coatings, are given in FIGS. 4 and 5 below.

It can be seen in FIG. 4 that as the laydown of Polymer C increased the adhesion of the hydrophilic layer, although the effect was inferior to that obtained with gelatin alone. In addition, it was also possible to coat useful mixtures of Polymer C and gelatin. In the same way, it can be seen in FIG. 5 that as the laydown of Polymer D was increased the adhesion of the hydrophilic layer increased, again, an effect inferior to that obtained with gelatin alone.

As with Polymer C, it was also possible to coat useful mixtures of Polymer D and gelatin.

The Tg of the 'polymer' was measured by DSC as described above.

Other polymers suitable for use in the present invention, possessing functional groups and a Tg of less than 15 C, include the following:

Poly(ethyl acrylate-co-2-aminoethyl methacrylate hydrochloride-co-2-hydroxyethyl methacrylate (60/15/25) (Tg $^{-}$12 C)

Poly(ethyl acrylate-co-2-aminoethyl methacrylate hydrochloride-co-2-hydroxyethyl methacrylate (50/15/35) (Tg $^{-}$16 C)

Poly(n-butyl acrylate-co-2-aminoethyl) methacrylate hydrochloride-co-2-hydroxyethyl methacrylate (50/10/40) (Tg $^{-}$20 C) and Poly(n-butyl acrylate-co-N-(3-aminopropyl) methacrylamide hydrochloride-co-2-hydroxyethyl methacrylate (50/15/35) (Tg $^{-}$22 C).

However a polymer such as poly(methyl acrylate-co-2-aminoethyl) methacrylate hydrochloride-co-2-hydroxyethyl methacrylate (50/15/35) having a Tg of $^{+}$90 C is not suitable as satisfactory adhesion can only be obtained by heating to above the Tg point and thus is a comparative example for the purpose of this invention The invention has been described in detail with particular reference to certain preferred embodiments thereof, but it will be understood that variations and modifications can be effected within the spirit and scope of the invention.

What is claimed is:

1. A planographic printing element comprising:

(i) a substrate layer having coated thereon (ii) an adhesion layer, (iii) a hydrophilic layer coated on and bonded to the adhesion layer, said layer comprising metal oxide particles and said adhesion layer comprising a polymer having a glass transition temperature of less than 15C and containing functional groups which are capable of bonding to the hydrophilic layer.

2. A planographic printing element as claimed in claim 1 wherein the metal particles comprise particles of titanium dioxide and/or aluminium oxide.

3. A planographic printing element as claimed in claim 1 which also comprises a silicate binder.

4. A planographic printing element as claimed in claim 1 wherein the functional groups in the polymer are selected from hydroxy, epoxy glycidyl, halide or sulfonate ester groups capable of being displaced by a nucleophilic group on the hydrophilic layer.

5. A planographic printing element as claimed in claim 1 wherein the polymer contains from about 25% to about 85% wt % of a monomer containing a functional group.

6. A planographic printing element as claimed in claim 1 wherein the polymer comprises a hydroxyalkylmethacrylate.

7. A planographic printing element as claimed in claim 1 wherein the polymer comprises also a co-monomer in relative amounts such that the glass transition temperature of the resulting polymer is less than 15 C.

8. A planographic printing element as claimed in claim 7 wherein the co-monomer is an alkyl acrylate.

9. A planographic printing element as claimed in claim 7 wherein the amount of co-monomer is from 15 to 75% by wt based on the combined weight of the polymer.

10. A planographic printing element as claimed in claim 7 wherein the polymer is a terpolymer also comprising a monomer to provide the capability of crosslinking with gelatin by means of gelatin hardeners.

11. A planographic printing element as claimed in claim 10 wherein the monomer is an aminoalkylmethacrylate or aminoalkyl-methacrylamide.

12. A planographic printing element as claimed in claim 10 wherein the amount of monomer is from 0.5 to 10% by wt based on the combined weights of the polymer.

13. A planographic printing element as claimed in claim 1 wherein the adhesion layer further comprises gelatin and wherein the polymer and gelatin are in relative amounts from 95:5 to 5:95 by wt.

14. A planographic printing element as claimed in claim 1 wherein the dry coating weight of polymer is from 50 $mg/m^2$ to $4g/m^2$.

15. A planographic printing element as claimed in claim 13 wherein the dry coating weight of polymer and gelatin composition is from 50 $mg/m^2$ to $4g/m^2$.

16. A method for the preparation of a planographic printing element which method comprises applying to a substrate a coating of a polymer to form an adhesion layer said polymer having a glass transition temperature of less than 15 C and containing functional groups capable of reacting with corresponding groups in a subsequently applied hydrophilic layer, and applying a coating of a hydrophilic material to the adhesion layer to form a hydrophilic layer, wherein the hydrophilic layer comprises metal oxide particles.

17. A method as claimed in claim 16 wherein the metal particles comprise particles of titanium dioxide and/or aluminium oxide.

18. A method as claimed in claim 16 wherein the hydrophilic layer also comprises a silicate binder.

* * * * *